US005999060A

United States Patent [19]

Zuta

[11] Patent Number: 5,999,060

[45] Date of Patent: Dec. 7, 1999

[54] DIGITAL FREQUENCY SYNTHESIZER SYSTEM AND METHOD

[76] Inventor: Marc Zuta, P.O. Box 2162, Petah Tikva 49120, Israel

[21] Appl. No.: 09/201,165

[22] Filed: Nov. 30, 1998

Related U.S. Application Data

[63] Continuation of application No. PCT/IL98/00152, Mar. 30, 1998.

[51] Int. Cl.[6] .............................. H03L 7/085; H03L 7/181

[52] U.S. Cl. ................................ 331/14; 331/16; 331/25; 331/1 A

[58] Field of Search ............................... 331/1 A, 14, 16, 331/25

[56] References Cited

U.S. PATENT DOCUMENTS

| | | | |
|---|---|---|---|
| 5,182,528 | 1/1993 | Zuta | 331/1 A |
| 5,363,419 | 11/1994 | Ho | 331/1 A |
| 5,459,435 | 10/1995 | Taki | 331/1 A |

OTHER PUBLICATIONS

Zuta, "A New PLL With Fast Settling Time and Low Phase Noise", Microwave Journal, Jun. 1998, pp. 94, 96, , 98, 100, 102, 104, 106, 108. (331–25).

*Primary Examiner*—Siegfried H. Grimm

[57] ABSTRACT

A frequency synthesizer includes a first counter for counting cycles of an input clock and for generating a reference output bus, a VCO for generating an output signal, a second counter for counting cycles of the output signal and for generating a VCO output bus, and a phase detector for measuring the phase error between the reference bus and the VCO output bus and for generating a control signal which is applied to the control input of the VCO. The phase detector includes circuitry for computing a corrected bus by multiplying the VCO output bus with a correction coefficient proportional to the reciprocal of the modulo count of the second counter.

12 Claims, 7 Drawing Sheets

12
1
Ref. counter
14
62
Phase det.
623
63
DAC
64
LPF
3
VCO
33
74
7
Bus scaling means
44
4
VCO counter
723
72
Coeff. gen. means
42

Prior Art

DIGITAL FREQUENCY SYNTHESIZER SYSTEM AND METHOD

Cross-Reference to Related Applications

The present application is a continuation of the PCT application No. PCT/IL98/00152 filed on Mar. 30, 1998. The PCT application claims priority from the application No. 120552 having the same title, that was filed in Israel on Mar. 30, 1997.

FIELD OF THE INVENTION

The present invention relates to frequency synthesizer systems and methods, and more particularly to such systems which include a phase-locked loop with the phase error being derived from several bits of the counters in the loop.

BACKGROUND OF THE INVENTION

The frequency synthesizer generates the high frequency signal at a controlled frequency, that is used in wireless communications and a wide variety of other applications. One widely used implementation of the synthesizer is the Phase-Lock Loop (PLL) system. Another type of synthesizer implements a frequency loop using counters pair/computer system, uses a pair of counters to concurrently count a reference signal and the oscillator (VCO) signal, to compute the frequency deviation and correct it in a closed loop.

Of paramount importance in wireless is efficient use of the frequency spectrum. It is difficult to accommodate the growing number of users of wireless, while the frequency spectrum remains fixed and limited. An effective answer is to better utilize the available spectrum, by transmitting more information (at higher bits/second rates) in the available spectrum (per each Hertz of bandwidth).

Frequency synthesizers are an important part of communication systems.

They are used both for transmission and reception, and influence the achievable rate of communication (bits/second). The lower the phase noise of the synthesizer, the lower is the Bit Error Rate (BER) of the communication channel.

The occurrence of errors requires the retransmission of messages and more overhead, resulting in a low overall communication speed, even if the initial bit rate was high. Thus, the phase noise limits the actual, effective communication speed. Therefore, low phase noise is required of a synthesizer for wireless communications.

The BER can be decreased by increasing the signal to noise ratio, that is by transmitting at a higher power. This has other disadvantages, like shorter battery lifetime and possible damage to users from radio frequency radiation. Moreover, the cost for the transmitter is higher. Accordingly, for a given transmission rate and BER, by lowering the phase noise of the synthesizer it is possible to use a lower transmitted power, thus the battery lasts longer and the possible damage from radiation is diminished.

PLL devices have a finite, distinctive phase noise which influences the wireless system performance. Frequency loop devices have higher phase noise, because of the quantization error and other effects.

Frequency settling time is another important parameter in frequency synthesizers. Spread spectrum by frequency hopping is a proven method for effective spectrum utilization. The method requires that the synthesizer change the output frequency at predefined times. It takes time for the synthesizer to switch to a new frequency, with the time lost in the process limiting the performance of the communication channel. Counter pair/computer devices have fast settling times, but their use in communication systems is limited because of phase noise, uncontrolled phase errors and other limitations.

PLL devices have a long settling time. These devices are usually described as linear, closed loop systems. But the linear model holds only for the PLL in locked state.

Prior to lock-on (that is, during the transition to a new frequency) the device is nonlinear, with a complex process including "beats" or the phase approaching to and departing from the lock-on value, until lock is achieved. The complex process presents a difficult to predict settling time.

Long-term frequency precision is another important requirement of frequency synthesizers. PLL devices have a definite advantage, since the oscillator phase is locked to the reference, and thus the output frequency is a precise multiple or submultiple of that reference. The problem is the instantaneous frequency, which may exhibit large excursions, as detailed later.

Phase-lock loops have a precise output frequency without error, whereas frequency loops usually have a frequency error because of the truncation error and limitations in the computer capability and speed/performance overall limits.

My previous disclosure, as detailed in Israeli Patent No. 096351 and U.S. Pat. No. 5,182,528, describes a digital frequency synthesizer using a smart, computer- controlled closed loop to generate a precisely controlled frequency. The closed loop comprises the oscillator, the digital frequency measurement means, and a computer which is connected back to the oscillator. This is a frequency loop. There is no phase lock between the reference and the output signal. This is not a PLL.

This prior art synthesizer has a fast frequency switching, but requires a complex computation to find the frequency ratio, since the accumulated count may achieve large values. The ratio computation may take time to perform. Moreover, there are no provisions to achieve low phase noise, an important consideration in communication systems. There are no provisions to achieve phase coherency between the reference signal and the oscillator signal, another desired property in precise signal generators.

Phase Lock Loops (PLL) used at present achieve a phase lock between a reference and the output signal. However, in these PLLs there is a difficult trade-off between frequency switching speed, the reference frequency, the output frequency increment and the phase noise.

For example, to achieve fine frequency increments a low reference frequency is required. This, however, results in higher phase noise because of the additional noise introduced during frequency multiplication. The lower the reference frequency, the slower is the frequency switching because of the low pass filter required. At present, a widely used solution is the fractional counter PLL which allows for both higher frequency reference and fine output increments. This solution however introduces phase noise and the frequency switching is still slow.

Taki, U.S. Pat. No. 5,459,435, discloses a frequency synchronous circuit for obtaining original clock signal by removing noise components. This is basically a frequency control closed loop, with two counters counting cycles of a reference signal and a VCO output, respectively. The counters are concurrently activated for a time period T each time, with the reading in the counters being indicative of the frequency error. The difference between the counter readings indicates the frequency deviation.

This structure includes a storage/average unit that is applied to the reference readings. The purpose of the system, apparently, is to address the problem of a noisy reference signal. By averaging the readings of the reference counter, the noise in the reference is decreased.

Thus, Taki is not a phase-locked system but a frequency loop system.

Frequency loop systems have a nonzero frequency error, this resulting in lower performance systems. The only operation on the bus is averaging. There is no scaling/normalization of one bus (either the reference or the VCO bus) so that the two digital buses represent phase in the same units to allow direct subtraction between these buses.

Ho, U.S. Pat. No. 5,363,419, discloses a dual phase-locked loop having forced mid range fine control zero at handover. The system includes a coarse frequency control loop and a fine phase-lock loop. There is a specific method of transferring control from the coarse loop to the fine loop. The coarse loop is a frequency control type having a frequency error, and thus does not provide the high performance as disclosed in the present invention. The fine loop is has a regular PLL structure as known in the art, using just one bit of the reference that is compared with only one bit of the VCO counter.

There is no scaling/normalization of one bus (either the reference or the VCO bus) so that the two digital buses represent phase in the same units to allow direct comparison between these buses.

Contemporary wireless systems usually use a phase-locked synthesizer for better performance. Of the above cited references, Zuta and Taki are frequency control loops that do not achieve phase lock. Ho uses a phase lock system, however the PLL itself does not include means for achieving higher performance, except the coarse loop for achieving faster lock-on. A fast lock-on is achieved for a high reference frequency (25 MHz in the cited example), this having the disadvantage of coarse frequency resolution. That is, the output frequency can only be set on 25 MHz increments, for example 900 MHz, 925 MHz, 950 MHz, 975 MHz etc.

Some of the most important characteristics of a frequency synthesizer include the frequency precision, low phase noise, fast frequency settling time and good frequency resolution. Good frequency precision is achieved with phase-lock loops, that feature a zero frequency error. This performance is superior to that achievable with frequency loops, that usually have a finite nonzero frequency error. Low phase noise usually requires a high reference frequency; this, however, prevents good frequency resolution (fine frequency steps). Fine frequency steps result in higher phase noise because of the frequency multiplication.

None of the above-mentioned references addresses the problem of concurrently improving all the above mentioned synthesizer characteristics in a phase-lock system: the phase noise, frequency settling time and the frequency resolution.

A description of a frequency synthesizer using digital bus correction/normalization was published by the present inventor in the June 1998 issue of the "Microwave Journal" magazine, pp. 94–108, titled "A New PLL with Fast Settling Time and Low Phase Noise".

It is an objective of the present invention to provide for a digital frequency synthesizer with means for overcoming the abovedetailed disadvantages.

SUMMARY OF THE INVENTION

It is an object of the present invention to provide a system and method for frequency synthesis with means for generating a signal having low phase noise and means for achieving faster lock-on and settling time to a new frequency, together with fine frequency resolution.

According to the invention, a frequency synthesizer has a phase-lock structure, with digital means for fast measurement of the phase difference between the oscillator signal and a reference signal. The phase difference measurement means is capable of performing a plurality of measurements during one reference period, by using two or more bits from each of the reference and VCO counters, and by applying a correction/normalizing factor to one of the counter outputs prior to subtraction of one from the other to obtain a digital phase error word. The control signal to VCO is derived from that word. A filter with higher cutoff frequency is used.

According to another object of the present invention, the synthesizer includes synthesizer control means to allow easy and fast frequency switching, with simple external commands and interfacing.

The synthesizer achieves faster and predictable lock-on process to new frequency, using a counter pair means which count in phase and controller means to reset the counters prior to starting the lock-on process.

According to yet another aspect of the present invention, the synthesizer includes control means to perform separate, alternating cycles of first, phase error measurement and second, VCO correction. Controller means uses a counter pair which start counting simultaneously.

Moreover, the synthesizer includes control means to the VCO which takes into account the modulo count error because of the VCO counter.

The synthesizer also includes means for synchronizing the VCO correction with system operation constraints.

The synthesizer includes means for performing a dual analog/digital phase measurement, to achieve the benefits of fast frequency settling, low phase noise and long term frequency stability and precision.

Further objects, advantages and other features of the present invention will become obvious to those skilled in the art upon reading the disclosure set forth hereinafter.

DESCRIPTION OF THE PREFERRED EMBODIMENTS

A preferred embodiment of the present invention will now be described by way of example and with reference to the accompanying drawings.

The invention is detailed at three levels: A phase comparator which is faster, precise and stable (digital) and is an important component of the frequency synthesizer; A frequency synthesizer incorporating the fast phase comparator and additional means to achieve the desired properties, including among others, low phase noise and fast frequency switching; A communication system includes the synthesizer with synchronizing means therebetween to improve performance at system level.

Figure 1:
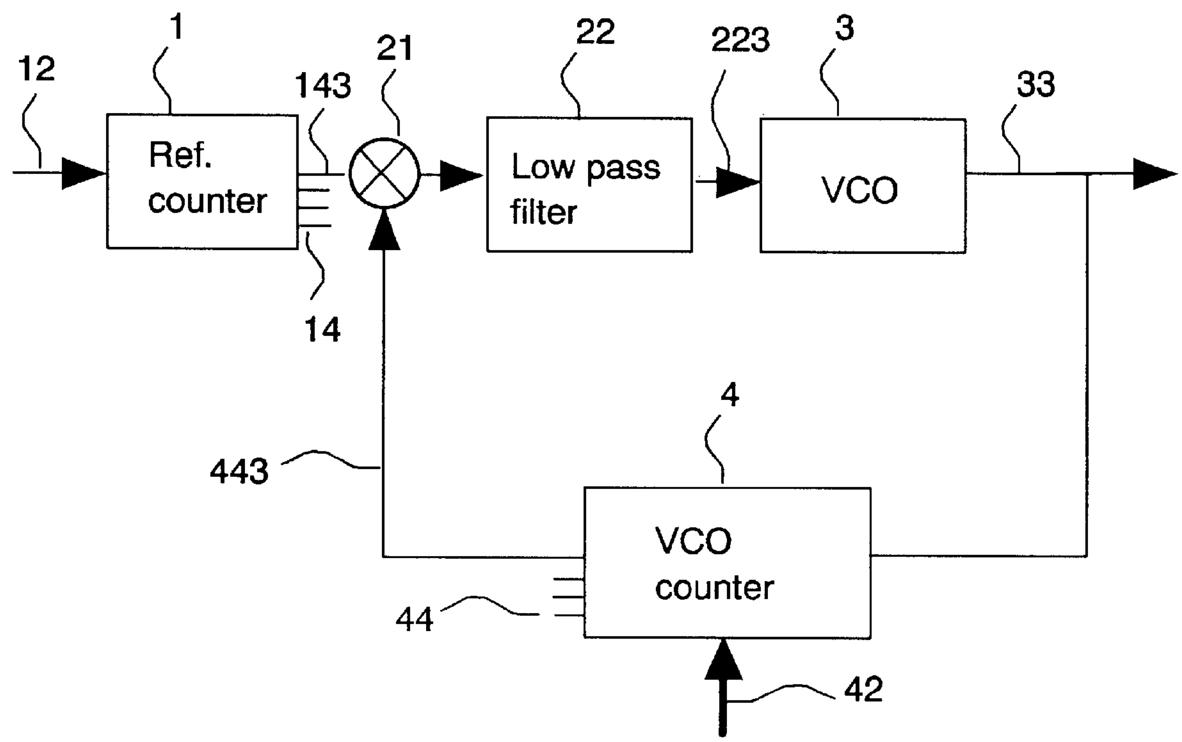
FIG. 1 details a prior art PLL.

FIG. 1 details a prior art Phase-Lock Loop (PLL) system. A reference counter 1 divides the frequency of the clock input 12, to generate the reference signal 143, at the reference frequency Fr. Usually, input 12 is derived from a crystal oscillator at a fixed frequency. Actually, counter 1 generates the reference counter output 14, a bus of several bits in parallel from MSB to LSB. Of bus 14, only the Most Significant Bit (MSB) is used, and is designated signal 143 here. The rest of the bits of counter 1 are not used.

The operation of the PLL is such as to keep a fixed relationship between the frequency at the output of voltage controlled oscillator 3 (VCO) and the reference frequency Fr. While the PLL is locked, or phase locked, then the output signal 33 is at frequency Fout, where $$Fout=V*Fr$$

V is the modulo of counter 4.

With the PLL locked, the output signal 33 has a frequency V*Fr. The frequency of signal 443, that is after division by V, is Fr again. Thus, analog phase detector 21 compares the relative phase of two signals 143 and 443, at the same frequency. If a phase difference is detected, then control signal 223 to VCO 3 changes accordingly, so as to correct that error. This is a closed loop, operating so as to keep the frequency of signal 33 at V times the frequency Fr of signal 143.

The frequency of signal 33 can be easily changed by changing the modulo count V of counter 4. Thus, Fout is a multiple of the reference frequency Fr. The frequency Fr thus defines the difference between adjacent achievable values of Fout.

The analog phase detector also includes the low pass filter 22, which transfers the desired phase error signal at low frequency, and stops undesired signals at frequency Fr and harmonics thereof. The cutoff frequency Fc of the filter 22 has to be lower than Fr. These undesired signals are generated in phase detector 21 and should be prevented from reaching the VCO 3, lest they modulate the frequency of the VCO to include undesired harmonics.

Set frequency bus 42 defines the parameter V, that is the modulo of counting, and thus the frequency Fout. Of the VCO counter output 44 (a bus, several bits in parallel from MSB to LSB ), only the Most Significant Bit (MSB) is used, which is the signal 443. The rest of the bus, that is the lower bits of VCO counter 4 are not used.

One disadvantage of this prior art PLL is the slow settling time to a new frequency, resulting from the low cutoff frequency of low pass filter 22, and the nonlinear lock-on process. The PLL is linear only while locked. Prior to lock-on, a nonlinear process takes place, with the frequency of VCO 3 changing and the control voltage 223 changing in "beats" until lock is achieved. LPF 22 slows down the process, by limiting the rate of change of signal 223. This is a result of system considerations, as follows:

Let us suppose that output frequency Fout is to change in 30 KHz increments.

This sets Fr=30 KHz. The LPF 22 should have a lower cutoff frequency Fc, for example Fc=5 KHz. The performance of LPF 22 in the frequency domain defines its performance in the time domain. The expected risetime and fall time are about $$Tr=2/Fc=400 \text{ microsecond.}$$

The PLL frequency settling time is about several times Tr, thus in the millisecond range.

The phase noise is affected as well by the low Fc. Suppose there is an undesired deviation in the frequency of VCO 3. The closed loop is supposed to correct that, however an indication of that deviation will be arrived at only after a time delay. The best the loop can do is to correct the VCO after that, but in the meantime a large error occurs. Since the VCO frequency tends to deviate all the time in a random unstationary fashion, there is a measure of phase noise in the PLL.

The abovementioned time delay results, inter alia, from the slow response of the same filter 22.

The fastest rate the phase measurement can be performed, as known in the art, is at the reference frequency Fr, that is one measurement per reference period Tr, with $$Tr=1/Fr$$

This is still only 33 microseconds, in the present example.

Additional sources of phase noise in prior art PLLs will be detailed below.

Figure 2:
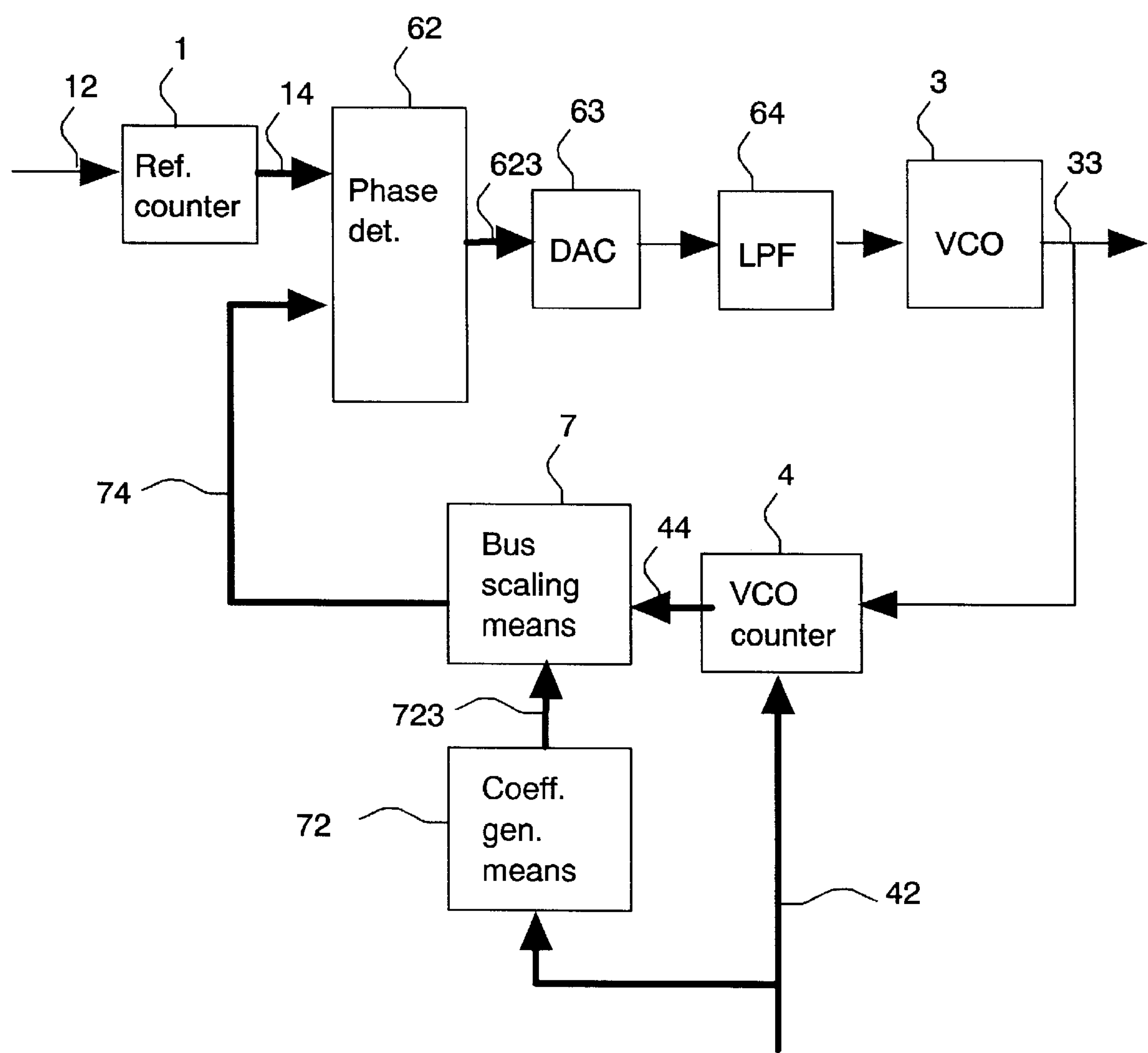
FIG. 2 illustrates the digital phase PLL structure.

FIG. 2 illustrates a simplified embodiment of the new system structure. According to the present invention, a digital phase detector replaces the prior art analog phase detector in the PLL. The digital phase detector 62 uses several of the available bus bits at the output of each of the counters 1 and 4. By using more of the available information (several bits of each counter), a faster and more precise phase measurement is performed.

The reference counter 1, which is dividing the clock input 12, provides the reference counter output bus 14. For example, if a 8 bit counter is used which counts to 256, then a full count of 256 corresponds to 360 degrees of phase of Tr, the reference period. Using the whole of bus 14, a phase resolution of 360/256=1.4063 degrees is achieved. Thus the phase of the reference signal can be read with a resolution better than one cycle.

To close the phase locked loop, the corresponding phase of the VCO counter 4 should be subtracted from the above reference phase, and the resulting phase error applied to the VCO 3, as in prior art PLLs. Here there is a problem, however. Whereas counter 1 counts to 256, counter 4 counts to a final value V derived from the desired output frequency Fout. Continuing the previous example, to generate a signal at Fout=15 MHz with a reference Fr=30 KHz, then a value V=500 is required. Thus, counter 4 counts in phase increments of 360/500=0.72 degrees.

Since counters 1 and 4 count to different values, with each bit corresponding to a different value, it is meaningless to subtract the values of the counters from each other.

Moreover, the modulo V of counter 4 is changed during the operation of the synthesizer. Thus, the problem is further aggravated by the fact that a bit at bus 44 does not correspond to some specific phase.

To address this hitherto unsolved problem, the reading of counter 4 as available on bus 44 undergoes a digital correction, using digital multiplier 7. Assuming counter 1 is full binary, that is it counts to a power of 2 like 2^A, then bus 44 is multiplied by a digital coefficient K applied through bus 723, such that $$\text{bus } 74=(\text{bus } 44)*K$$

with $$V*K=2^B$$

that is, the modulo of counter 4 is corrected by multiplier 7 to also become full binary, or a power of 2.

The powers of 2 of the two counters, A and B, need not be equal. If the adequate number of bits of the two buses 14 and 74 is taken, then the values therein approach the same final full binary value. In other words, dissimilarity between buses 14 and 74 because of a power of 2 is easily corrected by taking only part of the bits of one bus, starting at the MSB, and performing a shift of the bits of one bus relative to the other, while connecting to subtractor means 62.

Thus, for example, if bus 14 counts to 256 (8 bits) and bus 74 to 1024 (10 bits) this is achieved by taking only the 8 most significant bits of bus 74, while ignoring the rest of the bits (the lower bits).

For each desired value of parameter V, a corresponding correction coefficient K is applied, to correct to a full binary value at bus 74.

Table 1 is an example of the values for correction coefficient K, for several consecutive values of V, that is from 500 to 511. The coefficients in the table are the computed values, truncated to 2 places after the decimal point. The parameter A corresponds to the range of the result on bus 74, which is 2^AA.

TABLE 1

Coefficient for multiplication K, as a function of V

| V | AA = 15 | AA = 16 | AA = 18 | AA = 20 | AA = 22 | AA = 24 |
|---|---|---|---|---|---|---|
| 500 | 65.53 | 131.07 | 524.28 | 2097.1 | 8388.6 | 33554.4 |
| 501 | 65.40 | 130.81 | 523.24 | 2092.9 | 8371.8 | 33487.4 |
| 502 | 65.27 | 130.54 | 522.19 | 2088.7 | 8355.1 | 33420.7 |
| 503 | 65.14 | 130.29 | 521.16 | 2084.6 | 8338.5 | 33354.3 |
| 504 | 65.01 | 130.03 | 520.12 | 2080.5 | 8322.0 | 33288.1 |
| 505 | 64.88 | 129.77 | 519.09 | 2076.3 | 8305.5 | 33222.2 |
| 506 | 64.75 | 129.51 | 518.07 | 2072.2 | 8289.1 | 33156.5 |
| 507 | 64.63 | 129.26 | 517.04 | 2068.1 | 8272.7 | 33091.1 |
| 508 | 64.50 | 129.00 | 516.03 | 2064.1 | 8256.5 | 33026.0 |
| 509 | 64.37 | 128.75 | 515.01 | 2060.0 | 8240.2 | 32961.1 |
| 510 | 64.25 | 128.50 | 514.00 | 2056.0 | 8224.1 | 32896.5 |
| 511 | 64.12 | 128.25 | 513.00 | 2052.0 | 8208.0 | 32832.1 |

Thus, for example, the correction coefficient for V=500 and range 2^15 is K=65.53

This would result, for counter 4 value of 500, to a value at bus 74: 550*65.53=32,765

This corresponds (almost) to 2^15=32,768 The error stems from the truncation in the value of the coefficient, which should be 65.536. Implementing only the integer part of the coefficient (K=65) requires 7 bits and achieves a still larger error.

Note: For a counter modulo 500, the final value of the counter is 499, as known in the art. We use the value 500, which is never actually issued at counter's output, to indicate the theoretical value at the end of the reference period Tr.

The same holds true for a full binary counter, like modulo 256, which counts to 255. This to be understood to apply throughout the present disclosure.

It can be seen that 7 bits of precision for bus 723 may not be good enough, since several values of V result in the same coefficient K. The same applies for AA=16.

With AA=18 a better precision is achieved, with 10 bits of coefficient K Further increasing the precision of coefficient K achieves distinct correction for each value of V, with lower percentage of error as the precision is increased. This may require, however, more complex components or circuitry to implement. The invention thus discloses this method of counter reading correction, with the trade- off between performance and circuit complexity to be done during the design phase, according to the requirements of each implementation.

Another tradeoff includes averaging of a plurality of phase readings to improve precision. Since the phase may be measured at a fast rate in the megahertz range and the VCO correction may be performed at a lower rate, this leaves room for averaging to improve the precision.

Table 2 details the required number of bits B at bus 723 to represent the coefficient K, for each value of parameter AA chosen in Table 1.

TABLE 2

The preferred number of bits B as a function of coefficient AA

| AA | B, number bits |
|---|---|
| 15 | 7 |
| 16 | 8 |
| 18 | 10 |
| 20 | 12 |
| 22 | 14 |
| 24 | 16 |
| 26 | 18 |

Coefficient K is applied through scaling coefficient bus 723, generated in scaling coefficient generator means 72. A 16 bit coefficient can be easily generated with a memory device like a RAM, PROM, EPROM, Mask ROM, Flash Memory and more. 24 bit or more can be achieved, for example, using several such devices (not shown) in parallel. In another implementation (not shown), means 72 is implemented with computer means, which actually compute the required coefficient K when receiving a new value for the desired frequency on bus 42. This is a slower solution, since it takes time to compute the coefficient, but it may result in a lower cost system. A computation can be also used to achieve a higher precision (more bits in bus 723), without requiring a large amount of memory.

A one-chip microcomputer, like the Intel 80196, can be used to implement several functions of the device, like the coefficient generator 72, scaling means 7, subtractor 62, low pass filter and digital to analog converter 63. Although several of the blocks are implemented in software and not in hardware, the software implements the synthesizer method, as detailed below.

A method for generating a synthesized frequency signal comprises the steps of:

A. counting cycles of a fixed frequency clock signal, to generate a reference bus which contains a digital representation of the counting result at any given time, wherein the time for a full count is the reciprocal of the reference frequency;

B. counting cycles of a Voltage Controlled Oscillator (VCO), to generate a VCO bus which contains a digital representation of the counting result, and wherein the modulo of the VCO count determines the output frequency of the VCO, with the frequency being the result of multiplication of the reference frequency and the modulo count of VCO;

C. correcting the VCO bus by multiplying with a digital coefficient which is proportional to the reciprocal of the modulo count of the VCO;

D. computing a phase error by subtracting the corrected VCO bus derived in step (C) from the reference bus derived in step (B); and E. generating a correction signal proportional to the phase error found in step (D), and applying the correction signal to the control input of the VCO, to correct its frequency accordingly.

Throughout the present disclosure, it is to be understood that it is possible to correct either the reference bus or the VCO bus. In the latter case, step (C) above should be replaced by step (C2) as follows:

C2. correcting the reference bus by multiplying with a digital coefficient which is proportional to the modulo count of the VCO;

Referring again to the operation of the phase detector in the PLL, now the phase difference can be computed in subtractor 62, since buses 14 and 74 both have the same final value, thus each bit represents the same phase increment.

Thus, a precise computation of the phase difference is achieved, with a plurality of phase readings being performed during the reference period Tr.

To illustrate, Table 3 details the progression of the counters 1 and 4, the accumulated phase indicated on bus 14 and 74, and the phase difference at the phase difference bus 623, all during one time period Tr. Only the start and the end of the period Tr are illustrated.

TABLE 3

Progression of PLL counters, phase and phase error

| bus 14 | bus 44 | phase 14 | phase 44 | ph.diff 623 | average diff. |
|---|---|---|---|---|---|
| 0 | 1 | 0.0 | 0.7 | 0.720 | 0.180 |
| 1 | 2 | 1.4 | 1.4 | 0.034 | 0.188 |
| 1 | 3 | 1.4 | 2.1 | 0.754 | 0.377 |
| 2 | 4 | 2.8 | 2.8 | 0.068 | 0.394 |
| 2 | 5 | 2.8 | 3.6 | 0.788 | 0.411 |
| 3 | 5 | 4.2 | 3.6 | −0.619 | 0.248 |
| 3 | 6 | 4.2 | 4.3 | 0.101 | 0.084 |
| ... | | ... | | | ... |
| ... | | ... | | | ... |
| 254 | 496 | 357.1 | 357.1 | −0.067 | 0.447 |
| 254 | 497 | 357.1 | 357.8 | 0.653 | 0.636 |
| 254 | 498 | 357.1 | 358.5 | 1.373 | 0.824 |
| 255 | 498 | 358.5 | 358.5 | −0.034 | 0.481 |
| 255 | 499 | 358.5 | 359.2 | 0.686 | 0.669 |
| 256 | 500 | 360.0 | 360.0 | 0.000 | 0.506 |

Thus, bus 14 advances from 0 to the value 256 (which equals 0, the start of a new period Tr). During the same time period, bus 44 advances from 0 to 500 which is the modulo count for counter 4. The phase represented on bus 14 (and also on bus 74) increments by 360/256 degrees.

The phase on bus 44 increments by 360/500 degrees. The phase on both busses increases from 0 to 360 degrees, as expected.

The phase difference is fairly small, about one degree or less, during this period. Thus, about 256 to 500 phase readings can be taken during period Tr, with a high degree of precision in each.

The phase difference assumes positive as well as negative values. Using averaging means (not shown) at bus 623 can further decrease the phase error. The last column indicates the phase error for a running window average 4 consecutive phase readings.

According to the present invention, it was found that the phase error can be further reduced by adding an offset of 0.5 to the value of the phase in each of bus 14 and 44. In practice, add half LSB to both counters' 1 and 4 output bus, implemented by adding a bit after LSB (to become new LSB) which is hard-wire as "1" level. It would seem that this is ineffective if the corresponding fixed LSBs subtract and cancel each other. In actual operation, however, one bus undergoes scaling up or down in scaling means 7, thus the LSB becomes active and influences the result.

Accordingly, Table 4 illustrates the phase error for the same example as above, but with an offset of 0.5 added to counters 1 and 4.

TABLE 4

Progression of PLL counters and phase, with offset = 0.5

| bus 14 | bus 44 | phase 14 | phase 44 | ph.diff 623 | average diff. |
|---|---|---|---|---|---|
| 0 | 1 | 0.7 | 1.0 | 0.377 | 0.094 |
| 1 | 2 | 2.1 | 1.8 | −0.309 | 0.017 |
| 1 | 3 | 2.1 | 2.5 | 0.411 | 0.120 |
| 2 | 4 | 3.5 | 3.2 | −0.276 | 0.051 |
| 2 | 5 | 3.5 | 3.9 | 0.444 | 0.068 |
| 3 | 5 | 4.9 | 3.9 | −0.962 | −0.096 |
| 3 | 6 | 4.9 | 4.6 | −0.242 | −0.259 |
| ... | | ... | | | ... |
| ... | | ... | | | ... |
| 254 | 496 | 357.8 | 357.4 | −0.411 | 0.104 |
| 254 | 497 | 357.8 | 358.2 | 0.309 | 0.293 |
| 254 | 498 | 357.8 | 358.9 | 1.029 | 0.481 |
| 255 | 498 | 359.2 | 358.9 | −0.377 | 0.138 |
| 255 | 499 | 359.2 | 359.6 | 0.343 | 0.326 |
| 256 | 500 | 360.7 | 360.3 | −0.343 | 0.163 |

It can be seen that the phase error was reduced by adding the offset.

Referring again to the operation of the whole PLL system, the phase difference is obtained in digital form at bus 623. Digital to analog converter (DAC) 63 converts the phase difference to an analog signal, similar to the phase error signal to be found in prior art PLL at the output of phase detector 21 (see FIG. 1). The low pass filter 64 is similar to prior art filter 22 and has the same purpose, that is to remove frequencies beyond that of the phase error. The phase error signal is then applied to the voltage controlled oscillator 3 (VC0), like in prior art PLL, to close the phase control loop. The VCO generates the output signal 33, which again is divided in counter 4, and the closed loop operates as usual.

The filter 64 in the present invention differs from the prior art filter 22 in several issues. For one, the cutoff frequency Fc of filter 64 is much higher. Assuming again the reference frequency Fr of 30 KHz and 256 phase readings per reference period, now the sampling rate is 30*256=7.68 MHz. A cutoff frequency Fc=1 MHz is reasonable, thus the time response is about 200 times faster (1 MHz/5 KHz), to about 33 times faster (1 MHz/30 KHz). Thus, unlike prior art, the low pass filter 64 can now have a cutoff frequency Fc which is much higher than the reference frequency Fr.

The faster response time achieves that much faster settling time to a new frequency. Moreover, faster correction of VCO errors is achieved during lock-on. Fast detection of phase deviations is a prerequisite to efficient correction of these deviations, that is correction while these errors are still small. This contributes toward lowering the phase noise at the output 33.

Another difference is that filter 64 may be only used to control the response of the closed loop, not to remove harmonics in the phase difference. This is so because there are no harmonics in the phase difference bus 623. In prior art phase detectors, an analog phase detector used an analog multiplier or mixer to measure the phase difference. The analog multiplication inherently created the undesired harmonics at Fr and multiples thereof, which had to be removed.

Similarly, a prior art digital implementation with logic gates like a XOR resulted in a digital waveform at the output, with the duty cycle indicating the phase error value. Again, the digital waveforms included undesired harmonics at Fr and its multiples, which had to be removed by the low pass filter 22.

The digital phase detector in the present invention, however, outputs a digital word 623 which indicates the phase error in that parallel bus. That word remains unchanged until the next phase measurement is taken, thus resulting in a new valid phase error word on the bus. If correctly implemented using techniques in the art for logic design and critical race prevention, there are no undesired harmonics to correct at phase detector output 623.

Other embodiments of the invention are possible. For example, counter 1 may not be full binary, but may be BCD or Gray or count to another final value. This is less effective, however, since the bits of the bus and the hardware are not optimally utilized, and the computations may be made unnecessarily complex.

Counting may be implemented in software, like in a microcomputer or a DSP (digital signal processor), a PLA or other digital means.

A digital implementation (not shown) of low pass filter 64 is possible. Thus, filter 64 implements a digital algorithm to achieve the desired pole/zero function in the Laplace plane, as known in the art. A digital filter 64 is to be connected on the digital bus 623, before DAC 63.

Scaling may be applied to counter output 14 instead of output 44. This is less effective since the normalized bus will not reach a full binary value, and the precision with the same number of bits is lower. For various values of V, each bit will represent a different phase increment in this case, which may complicate the signal processing.

Buses 14, 74 should include at least two bits each for a 90 degree phase increment in each. Higher precision can be achieved by averaging. For better performance, clock 12 should have as high a frequency as possible, although that requires more stages and bits in counter 1.

This achieves a higher precision of the angle in bus 14, minimizing the rounding error because of the limited size of bus 14. Similarly, the maximum number of bits should be used in bus 74 to achieve better performance.

Scaling up or down is performed in scaling means 7, implemented as a binary multiplier. Such a multiplier has two input busses to receive bus 44 and bus 723, and an output bus 74 to issue the result of the multiplication. In a preferred embodiment, a signed multiplier is used, which can multiply positive as well as negative numbers. Thus, using a negative coefficient 723, a regular binary adder can be used in lieu of subtractor 62, to achieve the same mathematical function.

In another implementation, an unsigned multiplier is used, in conjunction with a binary subtractor or an adder with means (not shown) to compute the negative of bus 74 using 2's complements. A Binary Coded Decimal BCD multiplier can be used, together with a BCD bus 42 and BCD counter 4. This, however, does not make optimal use of the available bits and logic circuits.

Usually only part of the output bus is used, from the MSB. For example, for 16 bit counters 1 and 4 and a 16 bit correction coefficient 723, a 32 bit result is available at the multiplier output. Of these about 16 most significant would be used in bus 74, with the rest truncated (ignored) or rounded as known in the art.

Thus, the novel structure solves the difficult trade-off in prior art between frequency switching speed, the reference frequency, the output frequency increment and the phase noise. It is now possible to achieve both fine frequency increments, a lower phase noise and faster frequency switching.

Figure 3A:
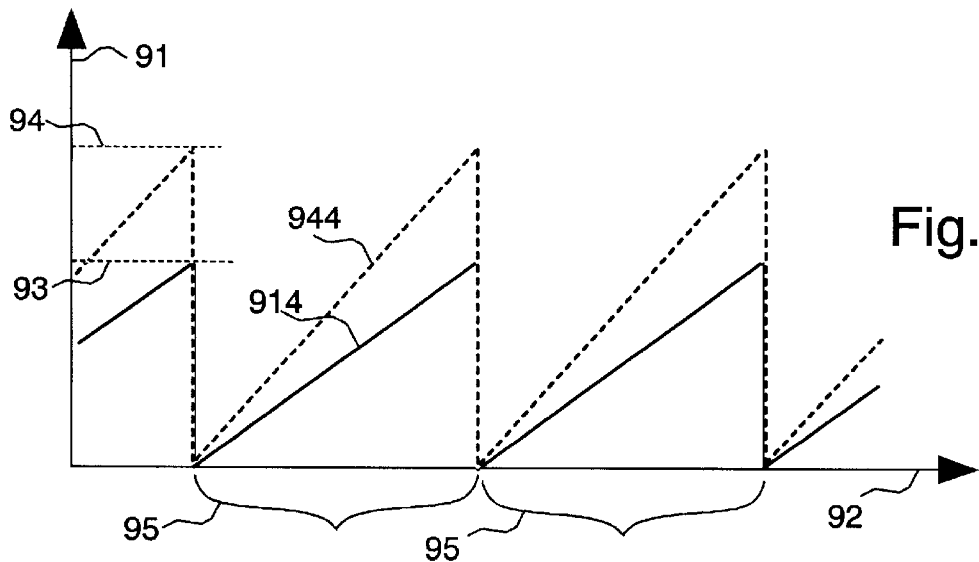
FIGS. 3A, 3B and 3C detail the counters operation and signals, with FIG. 3(A) detailing logical counter operation in prior art PLL, FIG. 3(B) detailing counter operation in the present invention and FIG. 3(C) detailing actual, physical counter operation in prior art PLL.

FIG. 3 details the signals generated in the PLL counters. FIG. 3(A) illustrates signals in prior art PLL, as detailed in FIG. 1: the value 914 of reference counter output 14 changes from 0 to the maximum value 93, which is 256 in the example as illustrated, while the value 944 of VCO counter output 44 changes from 0 to the maximum value 94, which is 500 in the example. The vertical axis 91 represents the value of the bus in digital form, and the horizontal axis 92 represents time.

Figure 3B:
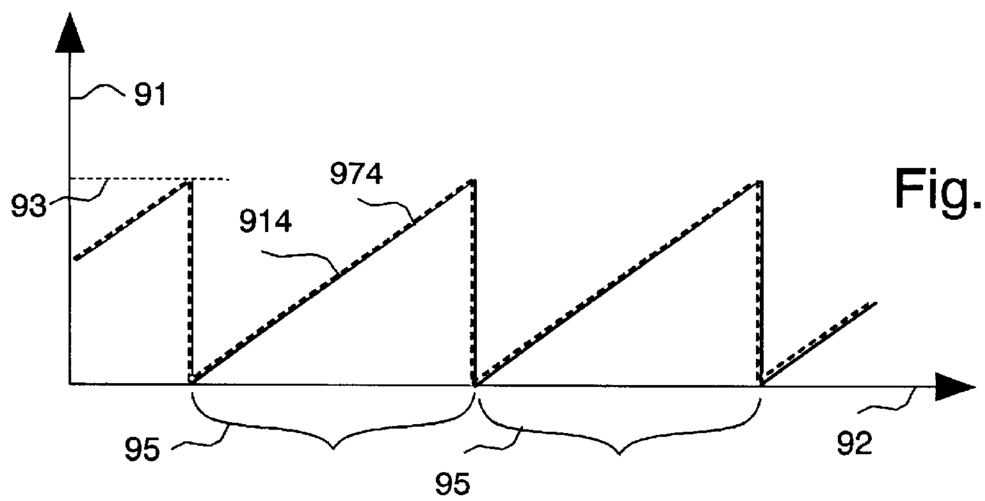

The counting time period 95 is the time for both counters 1 and 4 to start and finish a whole count, and then restart a new period 95. Time period 95 is the reference period Tr, equal to the reciprocal of the reference frequency Fr, thus Tr=1/Fr. FIG. 3(B) details signals in new system structure, as detailed in FIG. 2: here the value of reference counter output 914 and the value of normalized VCO counter bus 974 both reach the same maximum value 93, of both reference counter 1 and normalized bus 74. Again, the vertical axis 91 represents the value of the bus in digital form, and the horizontal axis 92 represents time. There is another difference between the old system cf. FIG. 1 and the new, cf. FIG. 2. Whereas in FIG. 1 the counters 1 and 4 count at a 90 degrees phase difference therebetween, in the new system cf. FIG. 2 the counters 1 and 4 count in phase, that is they start concurrently.

The reason is the basic operation of the phase detector: In the prior art PLL described in FIG. 1, analog phase detector 21 gives a "zero" indication (zero output voltage) while the input signals are at 90 degrees phase difference. A lower or higher phase difference results in a positive or negative output signal, respectively. The same holds for PLL systems known in the art, for either an analog implementation of the phase detector (like a mixer) or digital (like a XOR gate). The MSB of counters 1 and 4 thus have to be in quadrature, that is at a 90 degrees phase difference.

In the new PLL as detailed in FIG. 2 however, the phase detector actually compares the phase in both counters 1 and 4, thus while the loop is locked, the counters 1 and 4 count in phase. That is, both counters start counting (value 0) and end counting (final value) concurrently.

The present invention corrects a problem found in prior art PLLs, where counters 1 and 4 counted at a relative phase difference of 90 degrees, while using a phase detector on MSB alone. It was not possible to use the phase detector 21 of FIG. 1 concurrently with the digital phase detector 62 of FIG. 2, since the former required the counters 1 and 4 to count in quadrature, whereas the latter requires these counters to count in phase.

FIG. 3(A) ignored this effect, to illustrate the logical advancement of the counters, as is apparent to the phase detector, and so as not to obscure the principle of operation with details.

Figure 3C:
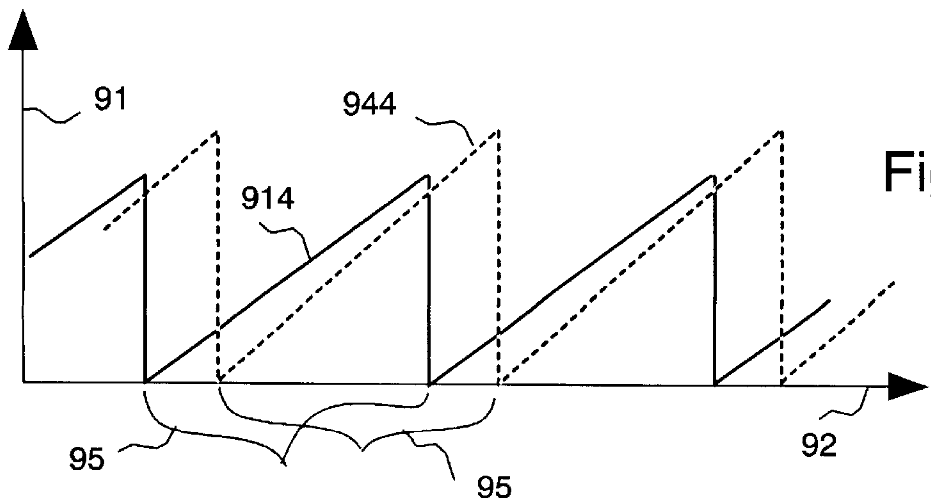

FIG. 3(C) details the actual signals in prior art PLLs, as detailed in FIG. 1. The value 914 of reference counter output 14 is in quadrature with value 944 of VCO counter output 44. That is, signals 914 and 944 are at a 90 degrees phase difference. In other words, the time difference between the start of 914 and 944 is a quarter of the time period 95. Since period 95 corresponds to 360 degrees, a quarter of that is 90 degrees.

The vertical axis 91 represents the value of the bus in digital form, and the horizontal axis 92 represents time.

Thus, prior art PLLs could at most perform one phase measurement during the reference period 95, for several reasons: each counter counts to a different end value, and each increment has a different angle equivalent, thus counter readings cannot be compared directly. Moreover, the counters counted in quadrature, so that there is always a phase difference between them, while the loop is locked. Therefore, no more than one phase reading per reference period could be performed in prior art PLLs, this limiting the rate of phase readings.

There is another advantage stemming from the counters starting concurrently, in that the lock-on process is faster, as detailed below.

Figure 4:
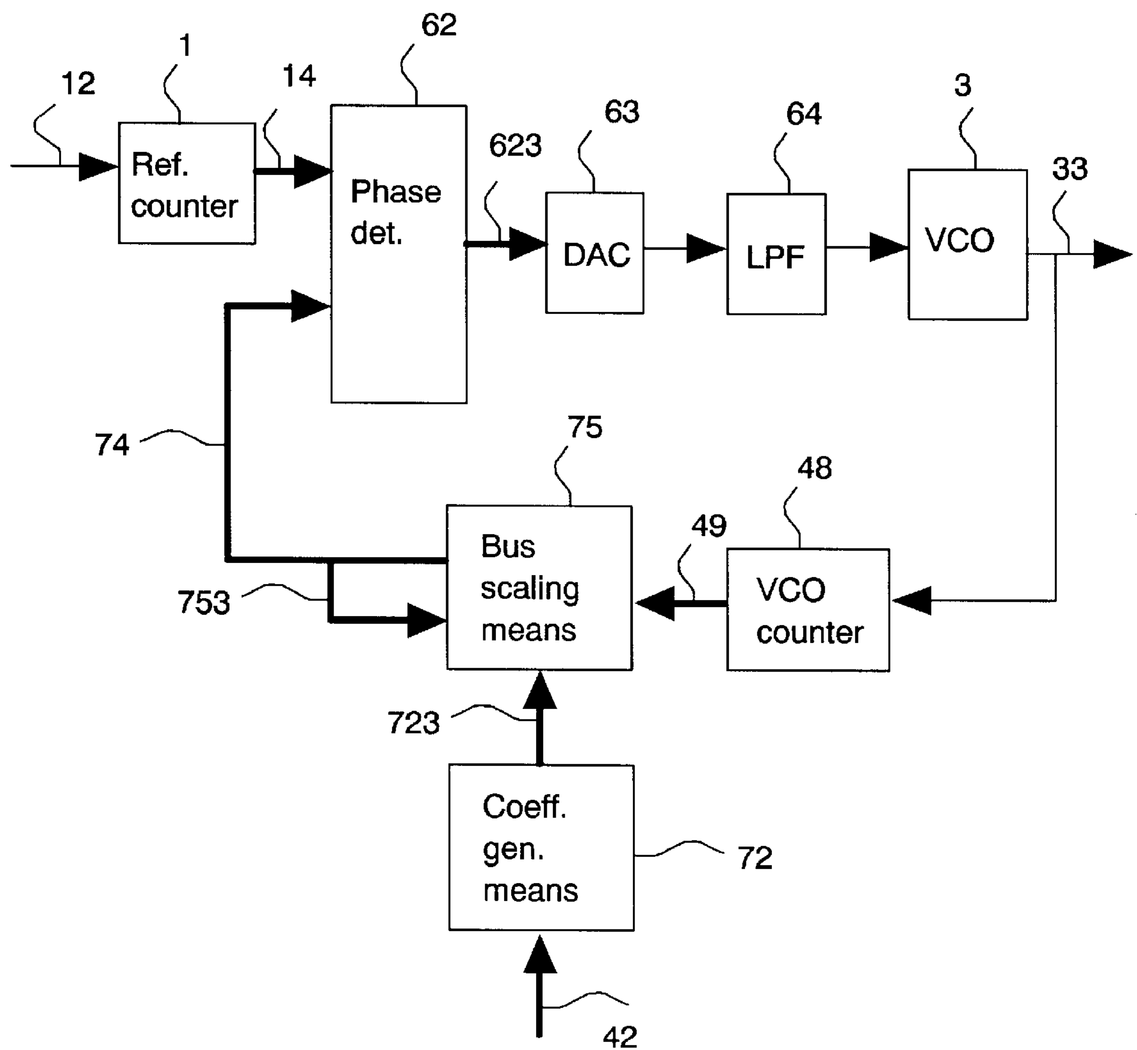
FIG. 4 details a digital phase PLL structure using binary adder.

FIG. 4 illustrates another embodiment for the new system structure, in a simplified form. It uses a binary adder 75 to replace the multiplier 7 and counter 4 as illustrated in FIG. 2, to achieve a normalized bus 74.

This is based on the fact that, in FIG. 2, counter 4 advances by one each cycle of signal 33, thus the output of multiplier 7 advances by a fixed portion D, starting at zero each reference period. The same end result can be achieved using a binary adder, as illustrated in this embodiment.

Thus, digital adder 75 implements the bus correction/normalization in a second embodiment as illustrated. An advantage of a digital adder is a simpler, lower cost implementation. Another advantage is that a very high precision may be achieved by stacking adder elements as known in the art. Multipliers may be stacked as well for increased precision, however this may require more complex circuits. Adder elements like the TTL 74283 include carry in and carry out pins for stacking several units, to easily achieve an adder having any number of bits, as desired.

Again, reference counter 1 counts clock input 12 to generate reference counter output 14 bus. Digital phase detector include subtractor means 62. The phase difference bus 623 is connected to digital to analog converter (DAC) 63, resulting in an analog phase error signal, which arrives at low pass filter 64 and is thence coupled to voltage controlled oscillator 3 (VCO), to close the phase lock loop.

The VCO 3 generates the output signal 33. Signal 33 is divided in optional VCO counter 48. The resulting signal 49 is used as a clock for adder 75. Each cycle of signal 49, a fixed coefficient 723 is added to the accumulating phase on bus 74. The adder has two inputs, the other input 753 being the accumulated phase itself.

Optional counter 48 is used to allow adder 75 to operate at a frequency lower than that of signal 33. Counters in the art can operate to well beyond 1 GHz, while adders are limited to the tens of MHz to about 200 MHz. Thus, counter 48 may be omitted, according to the frequency of signal 33 vs. the maximum operating frequency of adder 75.

As in FIG. 2, scaling coefficient bus 723 is generated in scaling coefficient generator means 72, according to set frequency bus 42.

A disadvantage of structure with adder 75: after one cycle, there may remain a small residual error, which would add to the next cycle and accumulate to large values. One solution is to ignore it and the small frequency error resulting therefrom. In counters in FIG. 2 it didn't happen since the counter 4 repeated the same cycle over and over again.

Another solution is to add a threshold detector (not shown) at the adder output 74. When the final value expected in each cycle is exceeded, the threshold detector resets the adder 75, so that the adder 75 starts each cycle precisely at zero. Thus the error accumulation is prevented.

Thus, there are various implementation to the system and method disclosed in the present invention, for achieving a corrected/normalized digital bus that can be directly compared to a second digital bus. Various digital circuits may advantageously be used to implement the functions as detailed in the present disclosure, to achieve the desired result of fast phase error measurement.

Figure 5:
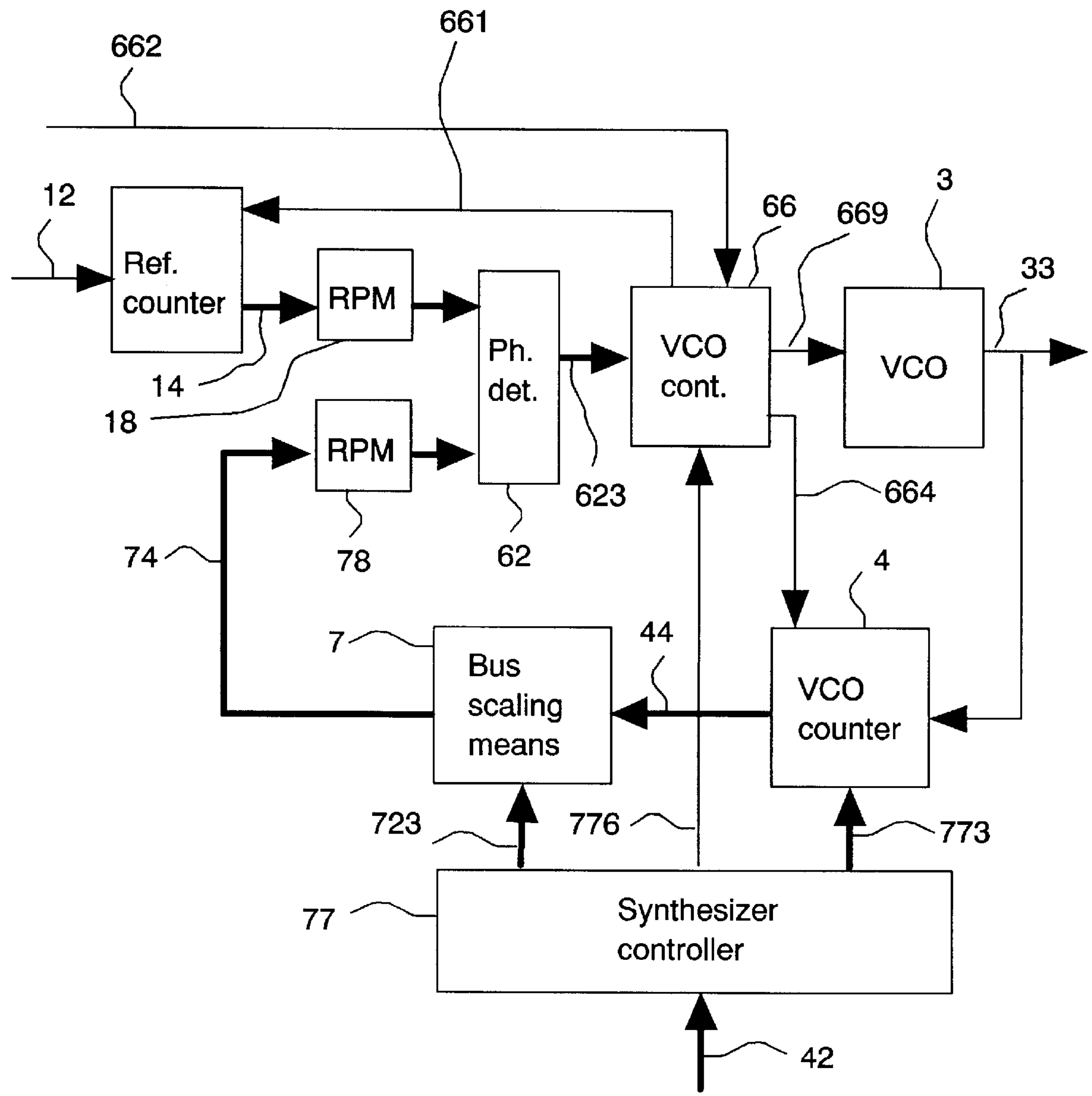
FIG. 5 details a digital phase PLL structure.

FIG. 5 illustrates the new system structure, detailing other features of the present invention. Again, reference counter 1 counts clock input 12 to generate reference counter output 14 bus. Digital phase detector includes digital subtractor 62, used to subtract normalized VCO counter bus 74 from reference bus 14, both in digital form as parallel busses.

Phase difference bus 623 is coupled to the VCO controller 66, which includes the digital to analog converter and the low pass filter (not shown). The resulting control signal 669 is coupled to the voltage controlled oscillator 3 (VCO), which generates the output signal 33. Counter 4 generates VCO counter bus 44, which is coupled to scaling means 7 to normalize the VCO counter output to generate normalized VCO counter bus 74.

Scaling coefficient bus 723 is generated in synthesizer controller 77. Controller means 77 receives desired frequency from set frequency bus 42. Means 77 includes scaling coefficient generator means (not shown). It generates the control bus 773 for counter 4, according to desired frequency, as well as the modulo control bus 773 for counter 4. While a new frequency is requested through bus 42, controller 77 updates busses 723 and 773 accordingly. By separating busses 42 and 773, it is possible to communicate short commands on the external bus 42 to save time and bandwidth, and to issue the detailed modulo command 773 only internally. This structure contributes to faster frequency switching.

According to another feature of the present invention, signal 776 indicative of a new frequency setting is coupled to VCO controller 66.

Thus, when it is requested that the synthesizer switch to a new frequency (through bus 42), then controller 66 receives an indication to that effect. Controller 66 then resets both counters 1 and 4 using reset lines 661 and 664 respectively.

This helps achieve a fast settling time to a new frequency, in a deterministic fashion rather than the nonlinear process in prior art PLLs. In prior art PLLs, after a change of frequency command the signals at the phase detector initially have a random phase difference, unrelated to the control signal to the VCO. The initial momentary phase may sometimes draw the VCO away from the final desired value, and a lengthy nonlinear process takes place.

In the present invention, however, counters 1 and 4 start counting in phase after counter 4 is set to the new modulo count and both counters are reset simultaneously by controller 66. As the count progresses, a small phase error may develop. Because of the fast rate of phase measurement, as detailed above, phase errors will be detected while still small. Controller 66 then computes new VCO control signal 669, resets counters 1 and 4 again and restarts the process. Thus, the PLL approaches fast the lock-on state, in a monotonous way, that is the VCO control is only changed to bring it closer to the final value. The process is deterministic and linear. Thus, the synthesizer performs a faster and predictable lock-on process to new frequency.

Controller 66 may include a (not shown) table with the characteristics of the VCO, that is the required control voltage 669 for each value of frequency of output signal 33. This allows to compute the best possible control voltage 669 for any desired frequency Fout, as a first iteration. The loop is closed then to correct for any VCO deviations.

Computer means (not shown) in controller 66 calculates the required control signals to the VCO 3 so as to bring the VCO to the desired frequency, thus achieving a fast frequency switching.

The required VCO control signal value may be computed using a table with VCO's data-words of required control signals to generate each one of a set of specific frequencies. The required precise control signal is computed using an interpolation algorithm.

Controller 66 also resets the counters initially (at turn on), to allow the synthesizer to settle fast to the initial frequency as desired.

In another embodiment (not shown), only one counter is reset, to bring it in phase with the other, this having the same effect. For example, sensing means (not shown) in controller 66 may detect when counter 1 reaches the value 0, and then to reset only counter 4.

Controller 66 also has the option to reset the counters when a change is made in the VCO control signal 669. This helps lower the phase noise in the output signal 33, by achieving better VCO control.

According to the present invention, to enable controller 66 to compute the optimal signal 669 at any given moment, it should receive the phase error of the VCO resulting from the last value of the signal 669 applied. In prior art PLLs, counter 4 counts all the time, and the accumulated phase therein is a result of the varying frequency of the PLL, resulting from the changing value of signal 669.

Thus, it is impossible to tell what is the phase error caused with the present value of signal 669. After some time, counter 4 holds only counts for the present signal 669, but in the meantime a mistaken phase error was fed to controller 66 and the signal 669 was changed again.

Thus, according to the present invention, there are two separate stages, first of phase error measurement and second of VCO correction, instead of a continuous concurrent phase measurement and VCO correction as in prior art PLLs.

In the new PLL, a measurement stage starts with resetting the counters 1 and 4, and continues with phase error measurement while the VCO control signal 669 is constant. This stage continues as long as the accumulated phase error is below a set limit. When a sizable phase error is detected, then controller 66 enters the second stage, of VCO correction.

An updated signal 669 is computed and applied to VCO 3, then controller 66 starts a new phase measurement stage by resetting counters 1 and 4.

Thus, controller 66 performs alternate cycles of phase error measurement and of VCO correction according to the measured phase error. This achieves an improved VCO control, since there is a well-defined relationship between the applied control signal 669 and the resulting phase error 623, allowing controller 66 to better decide what control to apply.

Moreover, in prior art PLLs, the structure is so as to strive to cancel any accumulated phase error, with the assumption that zero phase error corresponds to zero frequency error, the desired goal. Whereas this is true for zero errors, it was found that the goals for zero accumulated phase, for minimum VCO frequency deviations and for low phase noise may be incompatible.

Thus, it may be possible for the VCO to undergo a sudden frequency deviation, as a burst of short duration. This occurs since the signal 33 has a random, nonstationary phase error associated therewith. This deviation results in a phase error indicated in bus 44, and the loop strives to correct the associated phase error 623. To do so, however, would require the VCO 3 to operate at a frequency away from the desired value, with a deviation in a direction opposite to that during the burst. Thus, for a given time until the accumulated phase is corrected, the VCO is kept at an undesired frequency.

Under some circumstances, it would be better to ignore the phase error and to keep the VCO at precisely the desired frequency. The criterion may be the rate of change of phase error with time.

Thus, controller 66 will perform the following control method:

1. Values of phase error 623 as function of time are kept in memory of controller 66, as FIFO. That is, last readings are kept and memory is updated accordingly, in a table of phase error vs. time, from the present going back a fixed number of samples.
2. The rate of change of phase error, that is (delta Phase)/(delta Time) is computed and kept in a second table, again as FIFO of last values from present back.
3. If an about constant rate of phase error is measured, this corresponds to a frequency error in the VCO, and the control signal 669 is to be updated to correct for that.
4. If a large phase error rate occurs for a short time, with low error rate preceding it and following it, then that is a short burst not indicative of VCO frequency. In that case, ignore the phase error and do not correct the control signal 669 to VCO 3.
5. (Optional) If an about constant rate of phase error is measured, and the rate of change is very slow, then switch to analog phase measurement instead of the abovedetailed digital phase measurement. Analog phase measurement, to be detailed in FIG. 6. below, has advantages for a locked loop without large disturbances.
6. (Optional) If analog phase measurement is active and a large phase error is detected, then switch back to digital phase measurement.

Referring to Step 5 above, the implementation of integrated analog/digital phase measurement PLL is detailed below with reference to FIG. 6. Analog measurement in this context achieves slower reading, but may be more precise, and is used for precise VCO control. It also achieves phase coherency between the reference and the output signal 33, without any quantization error.

Analog phase detection and use in the PLL is less efficient when a large disturbance occurs, as is expected to happen occasionally. If this happens, then a preferred method is to return to digital phase measurement and use in closing the loop.

For analog phase measurement, in the present invention controller 66 takes into account not only the measured phase error, but also the VCO counter modulo V.

In prior art synthesizers, an overlooked fact is that, to correct a phase error FI at the phase detector output, it is required for the VCO output to undergo a phase change of FIt, where $$FIt=FI*V$$

Thus, for a counter with V=500 and a phase error of 5 degrees, in a prior art PLL it is required that the VCO perform a change of 5*500=2,500 degrees, or about 7 complete cycles. To achieve that in a short time, for example 100 microseconds, a frequency deviation of the VCO of 70 KHz is required. To correct in 10 microseconds, a 700 KHz deviation is required. Since small phase errors are expected to occur about all the time, the output signal 33 exhibits a varying frequency with time, an undesired effect.

To attenuate this effect, in the present invention the controller 66 computes, for a given phase error at its input, the corresponding phase error at the output of the VCO.

Controller 66 then:

1) Decides whether to correct the whole phase error, or only part of it. The decision depends on the size of the error (a small error is more likely to be fully corrected, while a large error will be corrected only partially), and the rate of change of the error versus time, as detailed above (a slow prolonged phase rate is more likely to be fully corrected than a sudden change with a high phase rate of change).

2) Corrects the phase error in a controlled way, that is by causing the VCO a limited, controlled frequency deviation for a controlled time. Prior art PLLs did not perform a controlled, limited deviation of the VCO, but let the analog loop cope as best it could with errors, and thus generating a sizable phase noise in the process.

Thus, the synthesizer includes control means to the VCO which takes into account the modulo count error because of the VCO counter.

The sync input 662 allows the VCO 3 to be corrected during time intervals when deviations in the VCO will not affect system performance. For example, in a communication system (not shown) there are time slots for communications, slots for synchronization, and slots unused or idle. The system may indicate to controller 66, using sync input 662, when are the idle intervals. Controller 66, after phase error measurement and computation of update to signal 669, will wait with the application of that update until signaled through input 662 to do so.

Thus, VCO correction is synchronized with system timing, so as not to induce frequency deviations in the VCO at times critical to the system.

Therefore, the present invention details means to achieve lower phase noise with aspects at the system level, the synthesizer PLL level and the subunit (part of the PLL).

Further detailed in FIG. 5 are critical race prevention means 18 at output of counter 1, and critical race prevention means 78 at output of scaling means 7. These means are here illustrated as latches, with counters synchronous and synchronous multiplier 7, with timing unit (not shown) to synchronize all parts as known in the art, for critical race prevention (not shown).

The problem: two counters 1 and 4, count at different timing, independent of each other-counter 1 is synchronous with the reference clock, whereas counter 4 is synchronous with VCO. Means are required for preventing a critical race, that is undefined or erroneous counter readout because of their asynchronous change of state.

To subtract digital values, the counters have to be sampled concurrently, or at least the digital difference has to accept valid inputs. That is, inputs to be sampled at permitted times. For a counter, the permitted times does exclude a short time period wherein the counter output changes state, and the lines are thus in an undefined state. There is a "race" between the counter output which changes from old value to new value, and the sampling signal causing to read the output.

The race is "critical" in that a short, random time deviation will result in either the old or the new value being read, or an undefined value is read in between, if the sample is taken exactly while the output changes.

This is clearly a situation to avoid, if one is to control the VCO with reliable, correct phase difference values. A possible issue to consider is how to avoid a critical race, if the reference and the VCO change at time instants unrelated to each other.

A solution (not shown) to critical race is to use synchronous counters and logic, and to use only part of the bits on the busses 14 and 74 to achieve bus operation at lower frequency (higher bits change slower). Operation at about 1 microsecond rate is slow enough. Then read in controller 66 the aphase difference 623 at a faster rate, several times the bus change rate. Compare consecutive readings for consistency.

It is expected that most of the time there will be no critical race, thus several consecutive readings will give identical or close values. These are reliable readings. A critical race will normally result in a value differing from adjoining samples, thus an abnormal sample is recognized as such and is ignored in controller 66, using for example software algorithms or comparator/threshold logic means as known in the art.

Another solution (not shown) is to use a Gray code counter for one counter, that is the counter which is read with timing set by the other. In Gray code, only one bit changes between adjacent values, thus at most only a small error will be made, of one clock. After counter reading, the value is translated to binary value, using for example a ROM or EPROM. The binary value is used for computations as detailed above.

Bus scaling/correction may be performed in software, like a microcomputer or DSP device, or in a table like RAM, ROM, or in hardware. One microcomputer may be used for both controllers 66 and 77 and/or additional functions to be implemented in software.

Figure 6:
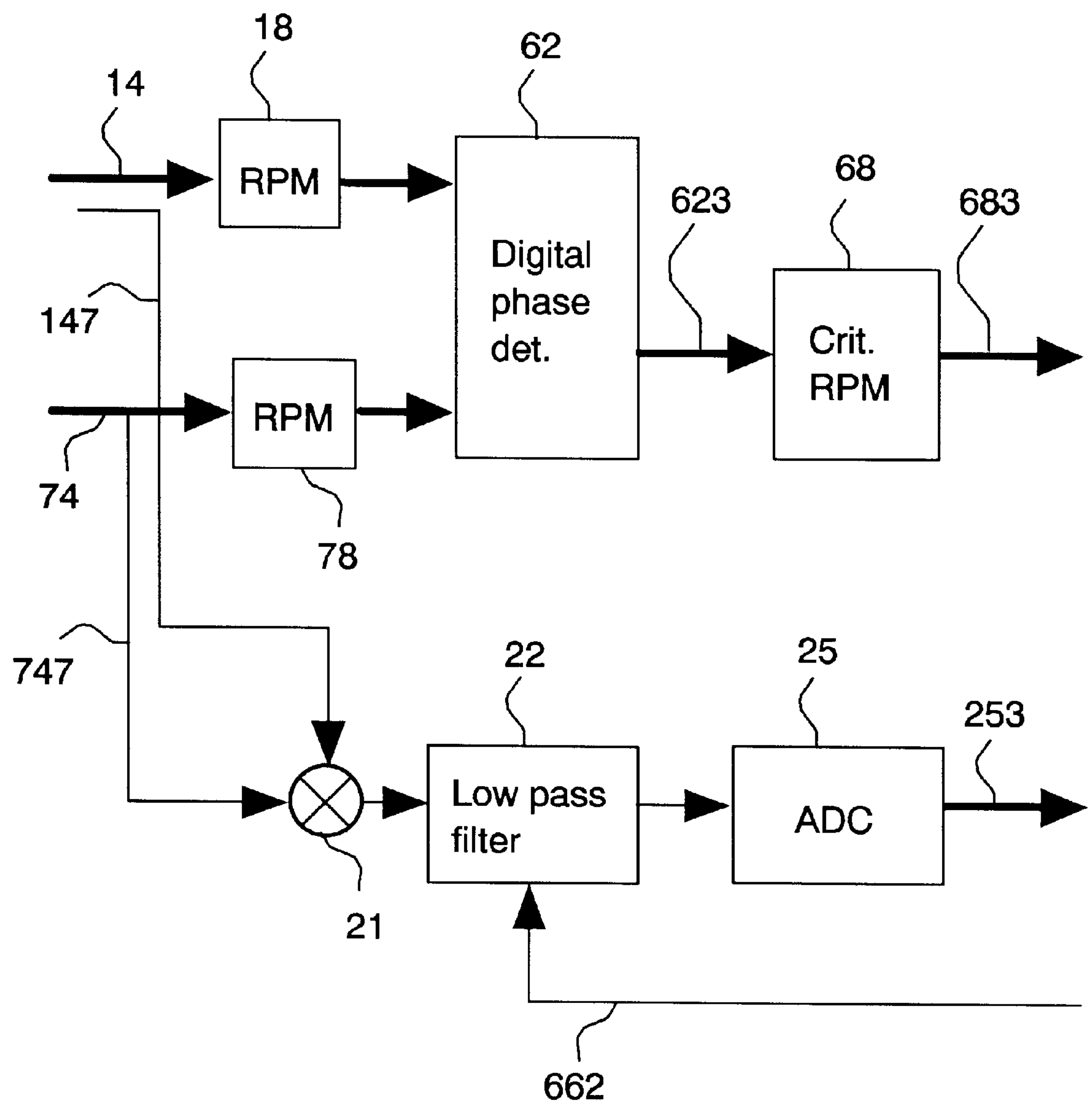
FIG. 6 details a phase detector structure.

FIG. 6 details the phase detector structure, including both fast (digital) and precise (analog) means, in an integrated structure. The analog phase detector may be advantageously used to achieve a better long-term frequency precision.

Reference counter (not shown) generates an output 14 (bus, several bits in parallel from MSB to LSB ) and a quadrature MSB reference counter output 147. Output 147 is a signal similar to MSB 143 (see FIG. 1) and possibly derived therefrom by a phase shift of 90 degrees, for example by a shift in time (either lead or lag) by a value equal to a quarter of the counting time period 95 (see FIG. 3).

This is required since counters for reference and VCO (not shown) count in phase, not in quadrature as in prior art PLLs. The analog phase detector, however, requires signals in quadrature. Therefore, one of the signals 147 or 747 should be shifted 90 degrees relative to its normal position.

Thus, both phase detectors, the analog and the digital, coincide in their readings for a locked VCO, with both counters operating in phase, that is both counters start a new counting cycle at the same time.

In a preferred embodiment, it is the reference signal 147 which is shifted, since this appears easier to implement—the reference is a derived from a binary counter, operating at a fixed frequency and with a fixed end count. It is easy to define the one quarter value or three quarters value and generate the second signal 147 accordingly, using combinatorial techniques as known in the art.

Digital phase measurement is performed by subtracting normalized VCO counter bus 74 from the reference bus 14, in subtractor means 62.

Critical race is prevented with critical race prevention means 18 at output of counter 1, critical race prevention means 78 at output of scaling means 7 and critical race prevention means 68 at output of detector 62. These means are here illustrated as latches, with synchronous counters and synchronous subtractor 62.

The phase difference is available at digital latched bus 683.

Analog phase detection is performed in detector 21 (like a mixer), with two analog signals coupled thereto: MSB VCO counter 747 and shifted reference counter MSB 147. Low pass filter 22 LPF is resettable, using reset command 666 from VCO controller (not shown).

Analog to digital converter 25 ADC generates digital words at bus 253 for the analog phase error, to use in the VCO controller (not shown).

In the above disclosure, counter normalization can be performed by multiplication of either the reference counter 1 or the VCO counter 4. The reference counter 1 need not count to a binary value, but to any value R. Similarly, VCO counter 4 may count any modulo V as desired. For the general case where counter 1 is modulo R and counter 4 modulo V, the correction coefficient to VCO counter 4 is K=R/V.

This is a coefficient for normalization by multiplication, that is the bus 44 is multiplied by K to result in the normalized VCO bus 74.

This multiplication changes any value on bus 44 within range 0–V to a range 0–B (the last is the final value of full range, which is never reached because of overflow). Thus the values in buses 14 (reference) and 74 (normalized VCO) are brought to the same range, and are to be about equal at any given time if the loop is locked. Any modulo count may be used for either counter 1 and 4.

A fractional logic may be used for the implementation of the multiplier, then this is the value K to be used to multiply counter 4 output bus 44. Fractional logic refers to a circuit where a decimal point is implied to be present ahead of the number, so the whole number is a decimal fraction, less than one. In another implementation, the decimal point is assumed to be located in a specific location somewhere in the digital word, so that part of the number is integer and the rest is a fraction. In a binary representation, of course it is not a "decimal point" but a "binary point", since the number is in base 2 rather than 10.

According to a specific implementation, the actual coefficient may be K multiplied or divided by a power of 2. This corresponds to only a left or right shift of one or more bits, and will not influence the actual values. The only effect may be overflow or truncation of information, and this is solved as known in the art.

If an integer multiplication logic is used, then K may be multiplied by a power of 2 (like 64, 256, 1024 etc.) large enough so an integer with enough precision bits is achieved.

The fractional part of the coefficient K is ignored (not used).

In another implementation, the reference counter 1 is normalized. Again, the counters 1 and 4 each can count to any modulo as desired. The normalization coefficient KK to be applied to counter 1 is KK=V/R. The actual value of KK may be used, or its shifted value, derived by multiplication or division by a power of 2. The normalization is performed by multiplying bus 14 by coefficient KK or a derivative thereof by multiplication with a power of 2. If a digital divider is used instead of a multiplier, then the values of the coefficients above are to be inverted (to 1/K or 1/KK respectively) to achieve the same mathematical and practical result.

It is easier to perform a digital addition than a digital subtraction. To do that, in a preferred embodiment (not shown) a negative coefficient 723 is used in multiplier 7, and the multiplier 7 is of a type which can handle negative binary numbers. Then the result or product bus 74 is negative, and a binary adder may be used to replace the subtractor means 62. Negative numbers may be represented with a 2's complement of a product.

The present inventor considers a preferred embodiment to include a binary counter 1 (to a power of 2) and correction by multiplication of the VCO counter bus 44, with multiplication with a negative coefficient.

A possible problem in the above embodiment is overflow in the counters. During most of a counting period, the two counters usually advance together, with a small difference representing the phase error in the loop. At the end of the counting period, however, a first counter will overflow to its initial value whereas the second counter still has a high value. This may result in an incorrect, large phase error that may induce an error in the loop.

This problem may be easily solved with a logic circuit (not shown) to detect the above overflow and to correct it. Overflow detection may be implemented for example with a circuit sensitive to the falling edge of each of the most significan bits (MSB) of the counters. Correction may be implemented by the addition/subtraction of a fixed value, or by disconnecting the phase error while it has an erroneous value.

Figure 7:
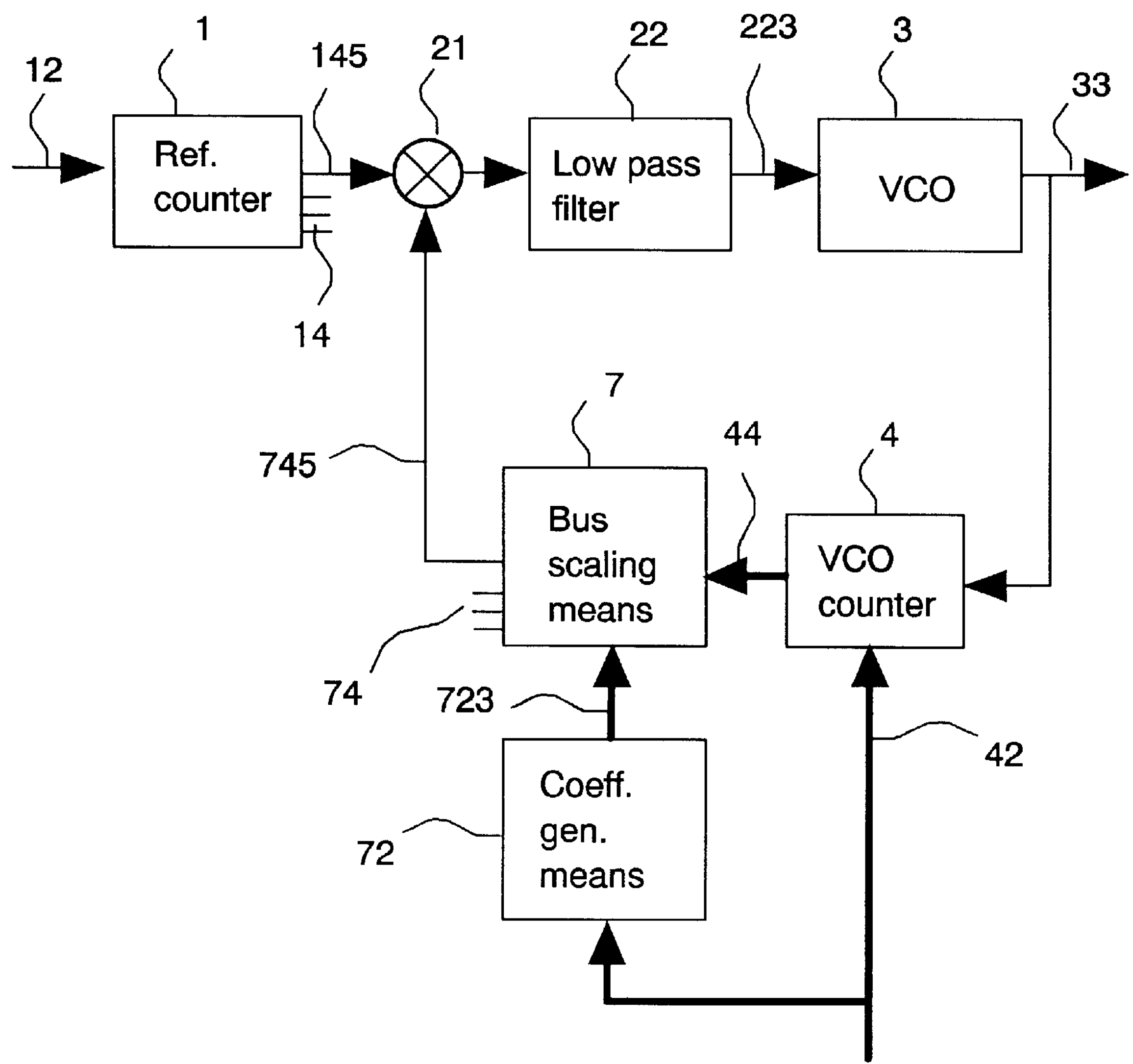
FIG. 7 details a digital phase PLL using a lower bit of the counters.

Another embodiment of the invention is illustrated in FIG. 7. This is based on the fact that bus normalization results in lower bits of the buses 14, 74 having the same frequency respectively. Thus, for example, the MSB in both buses is at frequency Fref; the second bit from MSB is at frequency 2*Fref in both buses; the third bit is at 4*Fref, the fourth bit at 8*Fref etc.

A simple PLL structure may be implemented similar to that in prior art as illustrated in FIG. 1, but using a lower bit of the counters 1, 4 instead of the MSB. This could not be done in prior art PLLs since the lower bits were at different frequencies, since the counters counted at a different rate to a different final value. In the present invention, however, the normalized bus 74 counts to the same value as bus 14 and at the same rate, when the PLL is locked. Thus, a lower bit in both counters may be used.

For example, let us assume in FIG. 7 that the second bit from MSB is used in bus 14 (signal 145) and in bus 74 (signal 745). Signals 145 and 745 both are at frequency 2*Fref, so an improved performance of the PLL is achieved, although the rest of the circuit is as in prior art: Signals 145 and 745 are compared in a one-bit phase comparator 21 like a mixer or a digital gate or an analog multiplier for example.

The resulting signal includes the phase difference information as well as harmonics. The harmonics are removed in low pass filter 22, and the resulting control signal 223 is applied to voltage controlled oscillator 3 (VCO).

This is similar to a regular PLL and has a simple, lower cost structure than the embodiments illustrated above. However, the performance is better than usual PLLs, as follows:

a. The reference frequency is double, 2*Fref. Therefore a low pass filter 22 with higher cutoff frequency may be used, to achieve a faster response time of the loop. The response time may be twice as fast as before.

b. The higher reference frequency reduces phase noise by 6 dB. It is known that in a PLL the phase noise of the reference is increased in the loop by 20 log (Fout/Fref) dB. If the Fref is increased 2 times, then the above ratio is decreased 2 times, and the phase noise at the output is reduced by 20 log(2)=6 dB (decibels).

Instead of the second bit from MSB, a still lower bit may be used. Then the response time is still faster, and the phase noise is lower. For example, the fifth bit from MSB may be used from both buses 14, 74 to form the signals 145 and 745 respectively. These signals are at a frequency 16*Fref, thus a 16 times increase in response speed is expected (the loop will settle to a new frequency in 1/16 the time it took before). Moreover, the phase noise at the output is decreased by 20 log(16)=24 dB.

Still lower (and faster) bits may be used in both buses 14, 74 to further increase the performance of the PLL.

Thus, a method for increasing the performance of a regular PLL includes the following steps:

1. use a first counter and a second counter to each count cycles of a reference clock and a VCO, respectively;
2. normalize the output bus of one of the counters, for example by multiplying with a coefficient proportional to the other counter modulo and inversely proportional to the normalized counter modulo;
3. use one bit of both buses for phase measurement, that is the output bus of one counter and the normalized bus of the other counter, while taking corresponding bits having the same frequency when the loop is locked; and
4. close a phase lock loop as in a regular PLL, wherein the phase detector uses for reference signal and VCO signal the bits taken as in step (3) above.

For improved performance, the additional following steps are taken in the above method, or are used to implement the system as detailed in FIG. 7:

A. the reference counter 1 counts to a binary value, that is a power of 2. The counter may count to 255 (modulo 256) or to 2047 (modulo 2048) etc. This is important so that the lower bits at higher frequency are symmetrical and without a phase jump at the end of the count, that is at the end of time period Tref=1/Fref. Otherwise, some bits may not count to a full half period at the end of the period, or the waveform is not symmetric. This results in harmonics in that signal, which may have a bad influence on phase noise when that bit is taken as reference for the PLL.

For a pure binary counter, each bit is a square wave including a base frequency K*Fref and its odd harmonics 3*K*Fref, 5*K*Fref etc. These harmonics can be easily removed in the LPF.

If the wave is not symmetric or there is an unfinished half cycle each time Tref, then lower harmonics are present in the waveform, that is Fref and its harmonics. These may be more difficult to filter out in the LPF.

Thus the preference for a binary implementation of reference counter 1. The clock input 12 from a crystal oscillator should be at a specific frequency which will result in the desired Fref after division in the binary counter 1, for the required frequency step size at output 33.

B. The modulo count of VCO counter 4 should be larger than the modulo count of counter 1. This ensures that there will be no missing values in bus 74, but the bus will generally assume successive values from 0 to the final count (V−1). This ensures that bus 74 will pass through all the binary values as in bus 14, and at the same rate. Thus lower bits on bus 74 will be generally symmetric with frequencies as in bus 14

This requirement may not be mandatory, since anyway bus 74 advances similarly to bus 14.

C. Signal 745 should be formed by sampling bus 74 synchronously with the clock 12 of the reference.

This may be implemented with an additional latch (not shown) having its data input connected to bus 74, and its clock (preferably edge-triggered) to clock 12. Otherwise a flip-flop may be used.

The reason is that bus 14 changes synchronously with clock 12. If the signal 745 from bus 74 is also synchronous to the same clock 12, then the signals are still closer to each other and the phase noise is reduced. This is not mandatory, however, since in any case the timing difference is not big, since both clocks 12 and 33 are fast.

D. A prescaler (not shown) may be used between output 33 and the input of counter 4. This may be required if output 33 is at a high frequency for example 900 MHz and the counter 4 is to operate at lower frequency, for example 20 MHz. In this example, a counter/divider by 45 may be used. When a prescaler is used, the reference frequency should be lowered by the same ratio, if the original frequency steps at output 33 are to be achieved. This can be done in counter 1, or the frequency of reference 12 be lowered by the same ratio. The second option is preferred, since it keeps counter 1 binary as required from considerations in item (A) above.

For still higher output frequency, downconverter means may be used (not shown) including oscillator and mixer means, with an optional prescaler.

E. The system may include means for the prevention of a critical race between counters 1 and 4. Counter 4 and optionally multiplier 7 are synchronized to the VCO, whereas counter 1 is synchronized to clock 12, so a critical race may occur if both clocks rise simultaneously.

One possible means for critical race prevention (not shown) is as follows:

a. clock R is connected directly to counter 1, adder etc. Clock V is directly connected to counter 4, multiplier 7. A latch or flip-flop with its data input connected to multiplier 7 has its clock connected to a means for generating a variable delay clock, to prevent critical race.

b. the means for generating a variable delay clock operate as follows: electronic circuit means receive both clock V and clock R. If clock V changes at a time different from the change in clock R, then clock V is output as is. If a change in clock R is detected simultaneously with that in clock V, then clock V output is delayed a small time interval, for example about 10 nanoseconds. This ensures that the modified clock V never changes at the same time as clock R, and there will be no critical race.

One possible implementation of the above is as follows: Both clocks R, V are delayed to allow time for a decision to be made. Means are connected to clocks R and V, to generate a short pulse at the rising edge of the corresponding clock. It is assumed that components in the system are activated at the leading edge of a clock. Electronic circuit means receive the short pulses both clock V and clock R with an AND gate detecting simultaneity in the change in R, V and activating a time delay of clock V if simultaneity was detected.

In still another embodiment of the invention, an integrated circuit may contain both counters 1 and 4, multiplier 7 and adder 62. Reference clock 12 and VCO signal 33 are transferred to the device. This saves a lot of wiring of the buses in the external circuits. If implemented in a DSP, then counter 1 may run from the clock of that DSP. This prevents interference between clocks and requires just one clock reference for PLL.

Although the term "Voltage controlled oscillator" was used in the description, it is to be understood that various forms of oscillator control may be used in lieu of a analog voltage. These include a control current, a digital word either in serial or parallel form, a combination of digital and analog signals, an optical signal like that transmitted through an optical fiber, and more. If a digital control word is used, then the DAC 63 is not necessary.

Bus scaling/normalization can be made by division with V or a coefficient proportional thereto, instead of multiplying with a coefficient proportional to the reciprocal of V. Other means may be used to achieve the same function, using for example a table in ROM or RAM.

It will be recognized that the foregoing is but one example of an apparatus and method within the scope of the present invention and that various modifications will occur to those skilled in the art upon reading the disclosure set forth hereinbefore.

I claim:

1. A frequency synthesizer for generating a signal at a desired frequency, comprising:

A. a voltage controlled oscillator (VCO) for generating an output signal at a frequency responsive to a signal at its control input;

B. a first means for counting cycles of a reference input clock and for generating a first output bus accordingly, and a second means for counting cycles of the output signal and for generating a second output bus accordingly, wherein the modulo count of each of the counting means is set to values corresponding to the desired frequency and a desired frequency step, and wherein a correction is applied to at least one of the output buses so as to bring the two output buses to the same counting range;

C. phase detector means for measuring a phase error using several bits from the first output bus and the second output bus, for generating a control signal derived from the phase error value and for applying the control signal to the control input of the VCO to close a phase control loop.

2. The frequency synthesizer according to claim 1, further including low pass filter means between said phase detector and said VCO control input.

3. The frequency synthesizer according to claim 1, further including digital to analog converter means after the phase detector, and wherein said VCO accepts a control input in analog form.

4. The frequency synthesizer according to claim 2, wherein said low pass filter has a cutoff frequency lower than the rate of update of said phase error.

5. The frequency synthesizer according to claim 1, further including control means for accepting a digital command indicative of the desired output frequency, and for setting said modulo count and for applying said bus correction according to said frequency.

6. The frequency synthesizer according to claim 1, further including means for resetting said first counter means and said second counter means when a digital command indicative of a request for a change of frequency is received.

7. The frequency synthesizer according to claim 1, further including control means to perform separate, alternating cycles of first, phase error measurement and second, VCO correction.

8. The frequency synthesizer according to claim 1, further including control means to the VCO which takes into account the modulo count error because of the VCO counter and for limiting the maximal VCO frequency deviation, to perform a controlled phase correction.

9. The frequency synthesizer according to claim 1, further including means for synchronizing the VCO correction with system operation constraints.

10. The frequency synthesizer according to claim 1, further including analog phase detector means, wherein one of said counters further includes means for generating a signal corresponding to the quadrature of the most significant bit, and said analog phase detector measures the phase difference between said signal in quadrature derived from one counter and the most significant bit of the other counter.

11. A method for generating a synthesized frequency signal, comprising the steps of:

A. counting cycles of a fixed frequency clock signal, to generate a reference bus which contains a digital representation of the counting result at any given time, wherein the time for a full count is the reciprocal of the reference frequency;

B. counting cycles of a Voltage Controlled Oscillator (VCO), to generate a VCO bus which contains a digital representation of the counting result, and wherein the modulo of the VCO count determines the output frequency of the VCO, with the frequency being the result of multiplication of the reference frequency and the modulo count of the VCO;

C. correcting the VCO bus by multiplying with a digital coefficient which is proportional to the reciprocal of the modulo count of the VCO;

D. computing a phase error by subtracting the corrected VCO bus derived in step (C) from the reference bus derived in step (A); and E. generating a correction signal proportional to the phase error found in step (D), and applying the correction signal to the control input of the VCO, to correct its frequency accordingly.

12. A method for generating a synthesized frequency signal, comprising the steps of:

A. counting cycles of a fixed frequency clock signal, to generate a reference bus which contains a digital representation of the counting result at any given time, wherein the time for a full count is the reciprocal of the reference frequency;

B. counting cycles of a Voltage Controlled Oscillator (VCO), to generate a VCO bus which contains a digital representation of the counting result, and wherein the modulo of the VCO count determines the output frequency of the VCO, with the frequency being the result of multiplication of the reference frequency and the modulo count of the VCO;

C. correcting the reference bus by multiplying with a digital coefficient which is proportional to the modulo count of the VCO;

D. computing a phase error by subtracting the corrected reference bus derived in step (C) from the VCO bus derived in step (B); and E. generating a correction signal proportional to the phase error found in step (D), and applying the correction signal to the control input of the VCO, to correct its frequency accordingly.

* * * * *